(12) United States Patent  
Yang et al.

(10) Patent No.: US 10,734,070 B2  
(45) Date of Patent: Aug. 4, 2020

(54) PROGRAMMING SELECTION DEVICES IN NON-VOLATILE MEMORY STRINGS

(71) Applicant: SanDisk Technologies LLC, Addison, TX (US)

(72) Inventors: Xiang Yang, Santa Clara, CA (US); Dengtao Zhao, Los Gatos, CA (US); Huai-Yuan Tseng, San Ramon, CA (US); Deepanshu Dutta, Fremont, CA (US); Zhongguang Xu, San Jose, CA (US); Yanli Zhang, San Jose, CA (US); Jin Liu, Fremont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/019,456

(22) Filed: Jun. 26, 2018

(65) Prior Publication Data

US 2019/0392893 A1   Dec. 26, 2019

(51) Int. Cl.
| | |
|---|---|
| G11C 11/56 | (2006.01) |
| G11C 16/04 | (2006.01) |
| G11C 16/08 | (2006.01) |
| G11C 16/14 | (2006.01) |
| G11C 16/34 | (2006.01) |
| G11C 16/24 | (2006.01) |

(52) U.S. Cl.
CPC ...... *G11C 11/5628* (2013.01); *G11C 11/5642* (2013.01); *G11C 11/5671* (2013.01); *G11C 16/0483* (2013.01); *G11C 16/08* (2013.01); *G11C 16/14* (2013.01); *G11C 16/24* (2013.01); *G11C 16/3436* (2013.01)

(58) Field of Classification Search
None
See application file for complete search history.

(56) References Cited

U.S. PATENT DOCUMENTS

| | | | |
|---|---|---|---|
| 9,922,705 B1 | 3/2018 | Diep et al. | |
| 2008/0205162 A1* | 8/2008 | Jeon | G11C 11/5621 365/185.23 |
| 2009/0027967 A1* | 1/2009 | Lee | G11C 16/0483 365/185.15 |
| 2009/0287879 A1* | 11/2009 | Oh | G11C 16/0483 711/103 |
| 2011/0211392 A1* | 9/2011 | Kim | G11C 16/0408 365/185.2 |
| 2013/0051156 A1* | 2/2013 | Mina | G11C 16/16 365/185.29 |
| 2013/0077408 A1* | 3/2013 | Ueno | G11C 16/06 365/185.22 |

(Continued)

*Primary Examiner* — J. H. Hur
(74) *Attorney, Agent, or Firm* — Volpe and Koenig, P.C.

(57) ABSTRACT

Non-volatile memory strings may include multiple selection devices for coupling memory cell devices to a bit line. Different programming operations may be used to program various individual selection devices in a non-volatile memory cells string. For example, a control circuit may set a threshold voltage of a particular selection device to a value greater than a threshold voltage of another selection device. In another example, the control circuit may program the selection device using an initial sense time. Subsequent to programming the selection device using the initial sense time, the control circuit may program the selection device using a different sense time that is shorter than the initial sense time.

25 Claims, 14 Drawing Sheets

(56) References Cited

U.S. PATENT DOCUMENTS

| | | | |
|---|---|---|---|
| 2013/0092994 A1* | 4/2013 | Shim | G11C 16/0466 257/314 |
| 2013/0100742 A1* | 4/2013 | Lee | G11C 11/34 365/185.18 |
| 2013/0114345 A1* | 5/2013 | Lee | G11C 16/0483 365/185.22 |

* cited by examiner

PROGRAMMING SELECTION DEVICES IN NON-VOLATILE MEMORY STRINGS

BACKGROUND

Technical Field

This disclosure relates generally to memory circuits, and more particularly, to programming selection devices in non-volatile memory strings.

Description of the Relevant Art

Computer systems include processors and multiple memory circuits that store software programs or applications, as well as data being operated on by the processors. Such memories may vary in storage capacity as well as access time. In some computing systems, memories may be arranged in a hierarchical fashion, with smaller, faster memory circuits coupled directly to the processors, and larger, slower memory circuits coupled to the processors via a memory controller communicating with the processors via a communication link.

The memory circuits included in computer systems may be volatile or non-volatile. Volatile memory circuits require application of power in order to maintain previously stored data. Once power is removed from a volatile memory, previously stored data is lost. Non-volatile memory circuits, however, have the ability to maintain previously stored data in the absence of power.

In many cases, volatile memory circuits are higher performing (e.g., have faster access times) than non-volatile memory circuits. Volatile memory also typically permits a greater amount of repeated data storage operations than non-volatile memory circuits. As such, volatile memory circuits are often better suited to main or cache memory applications within a computer system, while non-volatile memory circuits are generally employed for secondary or long-term storage due to their lower performance resulting from challenges in sensing data store in non-volatile memory cells.

Non-volatile memory circuits may use one of various non-volatile storage cells, such as flash cells, phase-change cells, ferroelectric cells, magnetoresistive cells, and the like. Such cells are programmed using a variety of techniques to adjust electrical or physical properties to encoded one or more data bits. The non-volatile data storage cells may be arranged in various cell array topologies. For example, the non-volatile storage cells may be arranged in a planar NAND string architecture, a three-dimensional NAND string architecture, a cross point architecture, or any other suitable architecture.

SUMMARY

Various embodiments of a non-volatile memory circuit are disclosed. Broadly speaking, an apparatus and a method are contemplated in which an array of non-volatile memory strings includes multiple data storage devices and multiple selection devices each coupled to channel that is coupled to a bit line. A selection device coupled to the bit line may be configured to control conduction in a portion of the channel. A control circuit may be configured to program the selection device by way of a programming operation that is different than another programming operation used for programming another selection device of the multiple selection devices. In one embodiment, to program the selection device by way of the programming operation, the control circuit may be further configured to set a threshold voltage of the selection device to a value greater than another threshold voltage for the other selection device. In another embodiment, to program the selection device using the programming operation, the control circuit may be further configured to program the selection device using an initial sense time and subsequent to programming the selection device using the initial sense time, program the selection device using another sense time shorter than the initial sense time.

Figure 1:
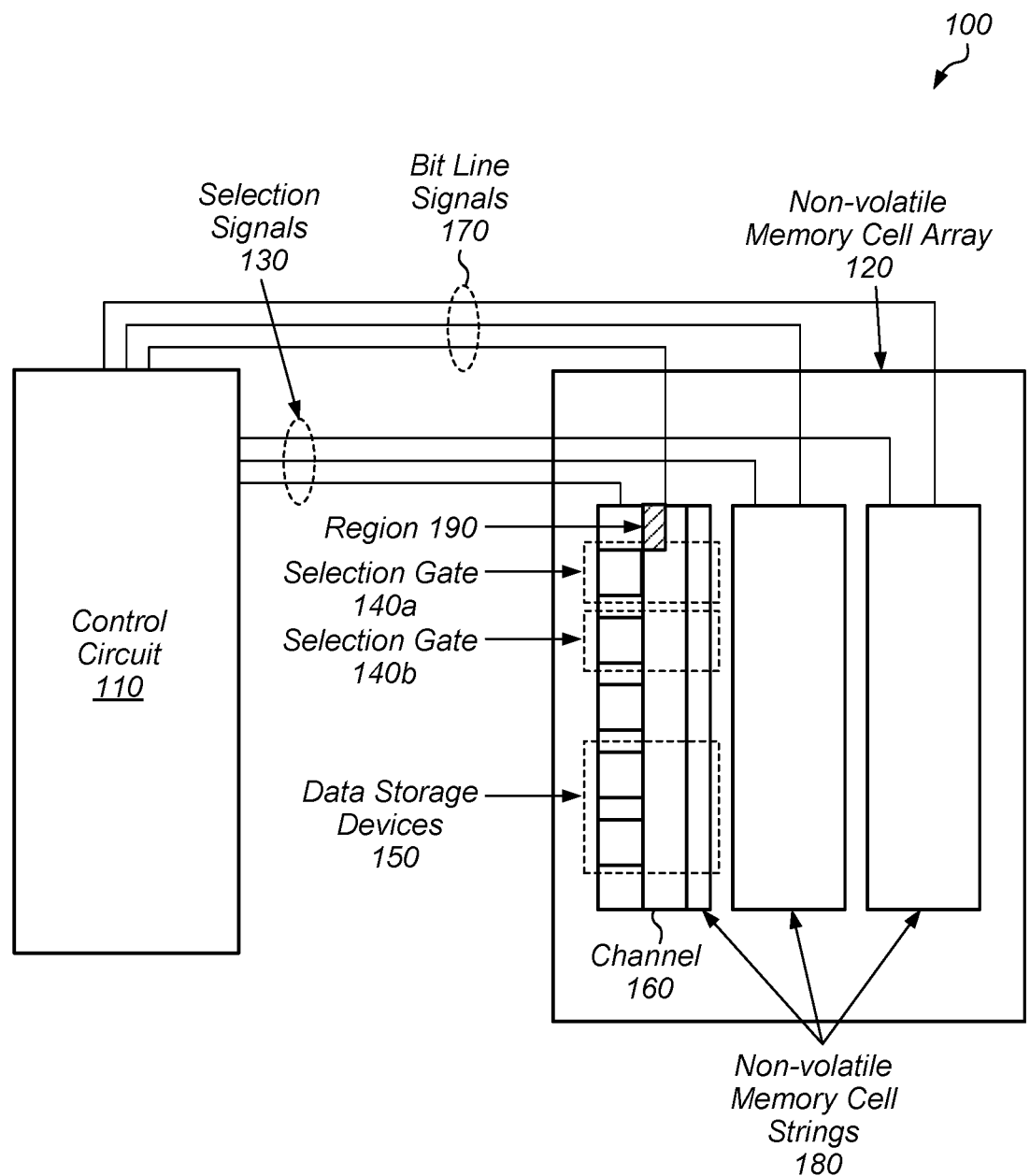
FIG. 1 is a generalized block diagram depicting an embodiment of a memory circuit.

While the disclosure is susceptible to various modifications and alternative forms, specific embodiments thereof are shown by way of example in the drawings and will herein be described in detail. It should be understood, however, that the drawings and accompanying detailed description are not intended to limit the disclosure to the particular form illustrated, but on the contrary, the intention is to cover all modifications, equivalents and alternatives falling within the spirit and scope of the present disclosure, including those defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Some NAND flash architectures employ three-dimensional strings of serially connected non-volatile memory cells that are coupled to respective bit lines and source lines using selection gates. A selection gate that couples the serially connected memory cells to a bit line is commonly referred to as a "select gate drain" device, while a selection gate that coupled the serially connected memory cells to a source line is commonly referred to as a "select gate source" device.

After manufacture and periodically during operation, threshold voltages of the select gate drain and select gate source devices included in a particular non-volatile memory cell string must be set to ensure proper operation of the non-volatile memory cell string. In some cases, manufacturing variations, such as differences in implants, n+ doping, and the like, may result in a region with undesirable electrical characteristics between a select gate drain device and its corresponding bit line. In some cases, the region may exhibit electrical characteristics of a transistor with poor subthreshold slope and a large drain induced barrier lowering effect—this type of region is commonly referred to as a "parasitic device" or a "parasitic region." A parasitic device or region, for purposes of this disclosure, refers to a region between a bit line and a select gate device that prevents proper programming of a memory coupled to the parasitic device. The particular electrical characteristics of the parasitic device may thus vary in different implementations and process technologies. Such parasitic devices are typically uncommon in non-volatile memory circuits. For example, in a particular non-volatile memory circuit, only 1% of selection gates are affected by parasitic devices; accordingly, parasitic devices do not affect the remaining 99% of selection gates.

When a parasitic device is present in this region between a select gate device and a bit line, programming a threshold voltage of the select gate drain device may be difficult. During a verification performed as part of the programming process, the verification process may falsely detect a threshold voltage associated with the region with undesirable electrical characteristics instead of a threshold voltage of the select gate drain device, effectively masking the threshold voltage of the select gain drain device and preventing proper programming of the select gate drain device.

Techniques for compensating for the effects of parasitic devices on selection gates during the verification process may adversely affect the selection gates that are unaffected by parasitic devices. The embodiments illustrated in the drawings and described below may provide techniques for programming a selection gate included in a non-volatile memory cell string that remediate the effects of parasitic devices in the non-volatile memory cell string. While compensation for the effects of parasitic devices on selection gates during the verification process could, in some cases, adversely affect the selection gates that are unaffected by parasitic devices, the disclosed embodiments are designed to remediate effects of parasitic devices on selection gates while not adversely affecting the programming of selection gates in non-volatile memory strings that do not contain parasitic devices. By employing such techniques, non-volatile memories that would otherwise fail testing and be identified as unusable may be used. The disclosed embodiments may thus advantageously improve the yield of the non-volatile memory.

An embodiment of a non-volatile memory circuit is illustrated in FIG. 1. As illustrated, non-volatile memory circuit 100 includes non-volatile memory cell array 120 and control circuit 110.

Non-volatile memory cell array 120 includes non-volatile memory cell strings 180. As illustrated, one of non-volatile memory cell strings 180 includes data storage devices 150, selection gate 140a, and selection gate 140b, each of which is coupled to channel 160, which is, in turn, coupled to one of bit line signals 170. For purposes of this disclosure, selection gate 140a is considered to be "adjacent" to one of bit line signals 170 because there are no other selection gates between selection gate 140a and bit line 170. Selection gate 140b, on the other hand, is not adjacent to be bit line 170 and is thus considered to be "nonadjacent" with respect to bit line 170. Note that while, in FIG. 1, selection gate 140a and selection gate 140b are referred to separately, this disclosure also uses the terminology "select gate drain" (SGD) device to collectively refer to one or more gates coupled in series between a bit line and one or more data storage devices. Gates 140a and 140b are also referred to herein as a plurality of selection devices or multiple selection devices. Those of skill in the art will appreciate that while selection gate 140a and selection gate 140b collectively operate together to serve as a select gate drain device, various embodiments may implement a select gate drain device consistent with this disclosure that uses more than two selection gates 140a/b.

Each of selection gate 140a, selection gate 140b, and data storage devices 150 are particular examples of non-volatile storage elements. In some cases, stored information may be encoded as a threshold voltage for a given on of data storage devices 150, which can be set by control circuit 110. Additionally, control circuit 110 may set threshold voltages for selection gate 140a and selection gate 140b. In various embodiments, the threshold voltages may be set for selection gate 140a and selection gate 140b after manufacture and in response to a number of program-and-erase cycles that have been performed on data storage devices 150 satisfying a threshold value.

To set threshold voltages for data storage devices 150, selection gate 140a, and selection gate 140b, control circuit 110 may employ a program-and-verify operation or simply a programming operation. During a program operation of the program-and-verify operation various techniques may be used to set the threshold voltage of a device. For example, in a particular technique, channel 160 may be held at or near ground potential while a particular one of selection signals 130 is asserted to a particular voltage level. In some cases, the particular one of selection signals 130 may be pulsed to the particular voltage multiple times.

After one or more pulses have been applied to one of the data storage device 150, selection gate 140a, or selection gate 140b, a verification operation is performed to determine if the desired threshold voltage has been programmed into the selected device. In various embodiments, the verification operation includes setting the particular selection signal to a voltage level substantially the same as the threshold voltage, while pre-charging a corresponding bit line to a given voltage level. If the threshold voltage of the selected device has been programmed to its desired level, then the selected device will conduct upon application of the voltage level on the particular selection signal, allowing the corresponding bit line to discharge through channel 160. As described below, a sense circuit may detect the change in the voltage level of the corresponding bit line and determine if the desired threshold voltage has been programmed. It is noted that typically all other devices in the non-volatile memory string are activated during the verification operation.

Depending on the desired threshold voltage and electrical characteristics of the device to be programmed, multiple program-and-verify operations may be performed until the desired threshold level has been programmed into the device.

As described below in more detail, parasitic regions such as region 190 may exist in some non-volatile memory cell strings 180 due to variations in implants or other doping in regions between a selection gate and a bit line. In some cases, a parasitic region may inhibit the ability of a selection gate to completely turn off (a state commonly referred to as "cutoff") and thus generate a high-impedance region in the channel 160. As used and described herein, "high-impedance" refers to an impedance in the body that is sufficiently large to prevent current flow through the body of the device. For example, in some cases the impedance in a transistor or gate may be on the order of tera-ohms. When a transistor is in cutoff, a small amount current (commonly referred to as "leakage current") may continue to flow through the body of the transistor. Leakage current in a properly functioning transistor is small enough to not affect the operation of other transistors coupled to the body of the transistor that is in cutoff.

In addition to affecting the ability of a selection gate to enter a high-impedance state, a threshold voltage associated with such parasitic devices can affect proper programming of certain selection gates when the threshold voltage of the parasitic device is greater than a target threshold voltage to which a selection gate is to be programmed. In such a circumstance, conventional programming techniques may falsely detect the threshold voltage of the parasitic device but not the threshold voltage of the selection gate. To compensate for the effects of parasitic devices in a non-volatile memory string, embodiments of control circuit 110 disclosed herein are configured to program the selection device 140a by way of a programming operation that is different than another programming operation used for programming selection device 140b. As will be explained below, programming a selection device (140a) that is adjacent to the parasitic device using a different programming operation than is used for a non-adjacent device (140b) permits the non-volatile memory string that includes these devices to be utilized as functioning memory circuit, thereby improving manufacturing yield.

In one embodiment, to program selection device 140a by way of the programming operation, control circuit 110 is configured to set a threshold voltage of selection device 140a to a value greater than a threshold voltage for selection device 140b. As described below in more detail, using a greater threshold value for a selection gate coupled to the bit line of a NAND string allows the effects caused by a parasitic device in the NAND string to be mitigated. In some cases, the programming operation uses a first threshold voltage and the other programming operation using a second threshold voltage that is less than first threshold voltage. By using different threshold voltages for different selection gates, a threshold voltage that is greater than the threshold voltage of the parasitic device may be employed, thereby preventing a false detection of the threshold voltage of the parasitic device and allowing proper programming of the selection gate. The electrical characteristics of the parasitic device as well as the properties of the semiconductor process on which the non-volatile memory device is fabricated may affect a value of the threshold voltage used to program the selection gate in order to overcome the effects of the parasitic device In cases where the selection gate adjacent to the bit line is programmed with a higher threshold voltage, a selection signal coupled to the selection gate will need a higher voltage level (compared to other selection gates in NAND string) in order to activate the selection gate during accesses to the memory cell devices included in the NAND string. To accomplish this, control circuit 110 is further configured to select one of non-volatile memory cell strings 180 by activating the selection device 140a using a control voltage level greater than another control voltage level used to activate selection device 140b.

In addition to programming different selection gates with different threshold voltages, control circuit 100 may employ a two-step program-and-verify operation when programming a selection gate adjacent to a bit line associated with a NAND string. The first program-and-verify operation is directed primarily to programming threshold voltages of selection gates that are affected by parasitic devices. During the first program-and-verify operation, the verification part of the operation is performed using a longer sense time and, therefore, a smaller sense current, than a sense time used during verification of the second program-and-verify operation, which is directed to programming threshold voltages of the selection gates to a level that is close to the final target voltage level.

While the first program-and-verify operation is directed to programming threshold voltages of gates that are affected by parasitic devices, selection gates unaffected by parasitic devices are also programmed to the same threshold voltage level as a result of this operation. The longer sense time may generate more sensing noise, so a distribution of threshold voltage of selection gates unaffected by parasitic devices may be wider than desired. Thus, the second program-and-verify operation is used for "fine tuning" by reducing the width of the distribution of threshold voltages of selection gates unaffected by parasitic devices. During the second program-and-verify operation, threshold voltages of selection gates affected parasitic devices are not being further modified since the parasitic devices mask the selection gates as described above. The voltage thresholds of the selection gates affected by the parasitic devices, therefore, remain at the level set by the first program-and-verify operation. By using two different sense times, the threshold voltage of selection gates affected by parasitic devices may be detected and verified, while still maintaining a desired distribution of threshold voltages for selection gates unaffected by parasitic devices.

To employ the two-step program and verify operation, control circuit 110 is further configured to program selection gate 140a using an initial sense time; and subsequent to programming the selection gate 140a using the initial sense time, program the selection gate 140a using another sense time shorter than the initial sense time. As used and defined herein a sense time refers to amount of time elapsed before comparing a sense voltage level based on a voltage level of a bit line coupled to a NAND string to a reference voltage. In cases where multiple selection gates are used within a NAND string, control circuit 110 may be further configured to perform a single program-and-verify operation on the other selection device.

Multiple techniques may be employed to compare the sense voltage level based on the voltage level of the bit line coupled to the NAND string to the reference voltage. One such technique uses a capacitor to generate the sense voltage level. The capacitor is pre-charged to a particular voltage level and then discharged through the selected NAND string. To program selection gate 140a using the initial sense time, control circuit 110 is further configured to discharge the previously charged capacitor via the non-volatile memory cell string and compare a voltage level of the capacitor to a reference voltage level after the initial sense time has elapsed. The initial sense time is long enough to allow a level of the current being discharged from the capacitor to reduce to a level where a voltage drop associated with a parasitic device in the non-volatile memory cell string at the current level is less than the threshold voltage selection gate 140a.

As described above, non-volatile memory strings include multiple serially connected transistors (also referred to herein as gates), each of which can be programmed to store one or more data bits. Such non-volatile memory strings may be constructed in various ways. In some cases, the serially connected transistors are fabricated on the surface of a silicon substrate in a planar fashion. Alternatively, the serially connected devices may be fabricated in a stack extending vertically from the surface of the silicon substrate. Non-volatile memory strings fabricated as stacks extending from the substrate are commonly referred to as "3D NAND strings."

Figure 2:
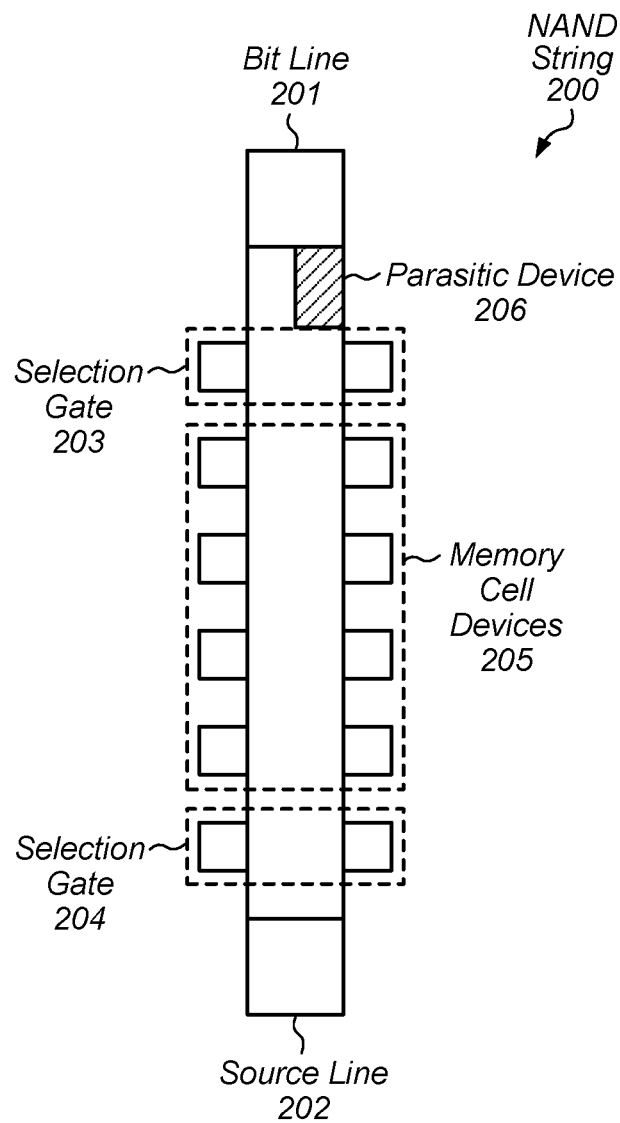
FIG. 2 is a block diagram illustrating an embodiment of a NAND string.

A cross-section of a 3D NAND string is illustrated in FIG. 2. As illustrated, NAND string 200 includes memory cell devices 205, selection gate 203, and selection gate 204. Selection gate 203 is coupled to bit line 201 and selection gate 204 is coupled to source line 202. As described below, control terminals of memory cell devices 205, selection gate 203, and selection gate 204 may be coupled to respective selection signals that are used to activate and program the individual gates. Selection gate 203 and selection gate 204 are configured to selectively couple memory cell device 205 to bit line 201 and source line 202, respectively. Each of memory cells devices 205 is configured to store one or more data bits as different threshold voltage values.

Memory cell devices 205, selection gate 203 and selection gate 204 are particular examples of non-volatile charge trap devices. As described below in more detail, a charge trap device includes an insulating layer that can trap electrons during a programming operation, A number of trapped electrons determine a threshold voltage for the device. As used herein, a threshold voltage refers to a voltage level applied to a control terminal of a charge trap device that enables conduction through the body of the charge trap device. When the voltage level applied to the control terminal of the charge trap device is less than the threshold voltage, conduction through the body of the charge trap device is prevented.

In some cases, variation during the manufacture of NAND string 200 results in undesirable electrical characteristics in the region of NAND string 200 between bit line 201 and selection gate 203. In some cases, such manufacturing variation results in parasitic device 206 being formed between bit line 201 and selection gate 203. Parasitic device 206 is one example of region 190 as depicted in FIG. 1. Parasitic device 206 may be a result of improper doping in the region between bit line 201 and selection gate 203. Although only a single parasitic device is depicted in the embodiment of FIG. 2, in other embodiments, multiple parasitic devices may be formed in a NAND string during manufacture. For example, a parasitic device may be formed in the region of NAND string 200 between selection gate 204 and source line 202. It is noted that although parasitic device 206 is depicted in a particular location between bit line 201 and selection gate 203, in various embodiments, different parasitic devices may be formed in various locations in circuit 100, including different location between bit line 201 and selection gate 203.

In some cases, parasitic device 206 may have electrical characteristics similar to a poorly operating transistor, resulting in an added impedance in series with selection gate 203. Such an added impedance can affect the flow of current through NAND string 200 from bit line 201 to source line 202. Changes in the current flow through NAND string 200 can affect certain sensing operations making certain program-and-verify operations difficult. Specifically, changes in the current flow resulting from parasitic device 206 can affect the ability to sense a threshold voltage of selection gate 203.

In cases where the electrical characteristics of parasitic device 206 affect the ability to sense the threshold voltage of selection gate 203, the threshold voltage of selection gate 203 may be set to an undesirable value. For example, the threshold voltage of selection gate 203 may be set to a value that is insufficient to prevent selection gate turning off completely, allowing leakage current to flow through NAND string 200. Such leakage currents may affect power consumption of a non-volatile memory circuit or render it unusable, thereby decreasing manufacturing yield. Using the techniques described above, and elsewhere in this disclosure, the effects of parasitic device 206 may be reduced or eliminated, preventing the aforementioned yield loss.

The embodiment illustrated in FIG. 2 is merely an example. In other embodiments, different numbers of gates and different types of gates may be employed.

Figure 3:
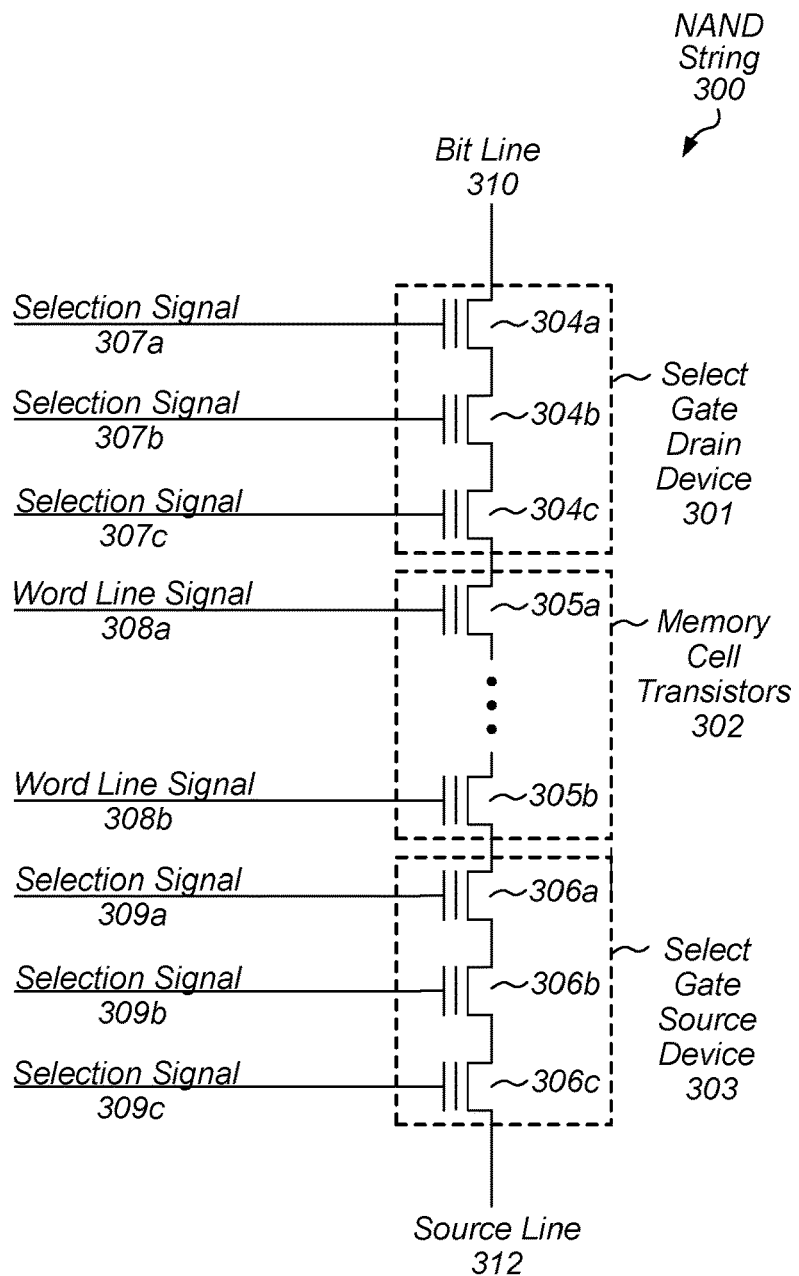
FIG. 3 illustrates a schematic diagram depicting an embodiment of a NAND string.

A schematic representation of a NAND string is illustrated in FIG. 3. As illustrated, NAND string 300 includes select gate drain device 301, memory cell transistors 302, and select gate source device 303. Select gate drain device 301 includes transistors 304a, 304b, and 304c. Memory cell transistors 302 includes transistors 305a and 305b. Select gate source 303 includes transistors 306a, 306b, and 306c. In various embodiments, each of transistors 304a-b, 305a-b, and 306a-c may be charge trap devices configured to trap charge in an insulating layer, where the trapped charge determines a threshold voltage level at which the transistor activates and is able to conduct current.

Select gate drain device 301 is coupled to bit line 310 and memory cell transistors and is configured to selectively coupled the string of transistors included in memory cell transistors 302 to bit line 310 based on the state of selection signals 307a-307c. In various embodiments, selection signals 307a-307c may be included in selection signals 130 and may be based on a decoding of an address signal. By activating the transistors in select gate drain device 301, current may flow from bit line 310 to source line 312 based on a programmed state of memory cell transistors 302, which allows a determination of the programmed state of memory cell transistors 302, thereby determining the stored data.

In some cases, transistors 304a-304c may operate together as a single device (as indicated by the dashed box 301 around transistors 304). When operated together, transistors 304a-304c may be activated in parallel to couple bit line 310 to memory cell transistors 302. In a similar fashion, transistors 304a-304c may be deactivated in parallel to decouple memory cell transistors 302 from bit line 310. Such parallel operation may be accomplished by coupling selections signals 307a-307c together. Alternatively, coupling signals 307a-307c may have similar timing so that transistors 304a-304c can be activated or deactivated in parallel. In other cases, however, each of transistors 304a-304c may be programmed with different threshold voltages. When transistors 304a-304c are programmed in this fashion, the voltage levels of selection signals 307a-307c may be different in order to activate the transistors included in select gate drain device 301. For example, the threshold voltage of transistor 304a may be set to a value higher than threshold voltages of transistors 304b and 304c. As such, during program-and-erase operations on memory cell transistors 302, the asserted voltage level of selection signal 307a is greater than the asserted voltage level of selection signals 307b and 307c.

As described above, a two-step program-and-verify operation may be used to program one or more of the transistors 304a-304c. For example, in response to determining that a parasitic device exists between transistor 304a and bit line 310, such as, e.g., parasitic device 206, a two-step program-and-verify operation may be used to program a threshold voltage of transistor 304a. Such a two-step program-and-verify operation may use different sense currents and sense times as part of the verification portion of each step. By employing an initial program-and-verify operation with a longer sense time than a subsequent program-and-verify operation, effects associated with parasitic device 206 that mask the threshold voltage of transistor 304a may be reduced or eliminated.

It is noted that select gate source device 303 may be operated in a similar fashion to select gate drain device 301, including programming individual ones of transistors 306a-306c to different voltage threshold levels. Alternatively or additionally, a two-step program-and-verify operation may be used to set threshold voltages of one or more of transistors 306a-306c.

Each of transistors 305a and 305b included in memory cell transistors 302 is configured to store one or more data bits based on a value of an electrical characteristic of the transistors. For example, in some cases, a threshold voltage associated with one of memory cell transistors 302 may be set to a particular voltage level. The particular voltage level may correspond to a data bit value, or combination of data bit values.

Memory cell transistors 302 may be programmed in a similar fashion to the transistors included in select gate drain device 301 and select gate source device 303, although the programmed threshold voltages may correspond to a particular data bit value or combination of data bits values. By applying a programming voltage to a particular one of word line signals 308a and 308b while the channel between bit line 310 and source line 312 is held at or near ground potential, electrons can become trapped within an insulating layer included in the transistors, thereby setting threshold voltages for the transistors.

To retrieve previously programmed data from memory cell transistors 302, selection signals 307a-307c are set to voltage levels to enable transistors 304a-304c and selection signals 308a-308b are set to voltage levels to enable transistors 306a-306c. With the transistor groups 304 and 306 activated, bit line 310 may be pre-charged to a particular voltage level and word line signals 308a and 308b may be set to given voltage level sufficient to activate transistors 305a-305b. A selected one of word line signals 308a-308b may be decreased in voltage, which may deactivate its corresponding one of memory cells transistors 302 depending on how its threshold voltage has been set. If the corresponding one of memory cell transistors 302 remains activated, then bit line 310 will discharge through the string of devices into source line 312. If the corresponding one of memory cell transistors 302 deactivates, then bit line 310 will not discharge. The difference the voltage level of bit line 310 can be used to determine the data value programmed into the corresponding one of the memory cell transistors.

The retrieval process for previously programmed data is presented as an example. In other non-volatile memory circuit architectures, different retrieval processes may be employed.

It is noted that the particular NAND string depicted in FIG. 3 is merely one possible example. For example, in other embodiments, different numbers of transistors may be included in select gate drain device 301 and select gate source device 303.

Figure 4:
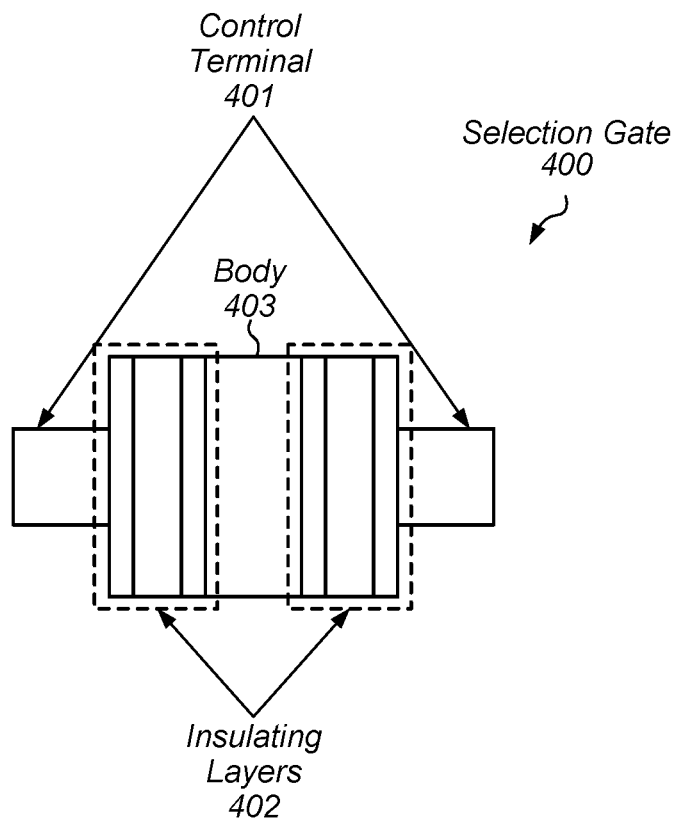
FIG. 4 illustrates a block diagram of a charge trap memory cell.

A cross-section of an embodiment of a selection gate is illustrated in the cross-section of FIG. 4. As illustrated, selection gate 400 includes control terminal 401, insulating layers 402, and body 403. In various embodiments, selection gate may correspond to any of selection gates 140a and 140b as depicted in FIG. 1, any of transistors 304 included in select gate drain device 301 as depicted in FIG. 1, or selection gate 400 as illustrated in FIG. 4.

In some embodiments, body 403 is cylindrical in shape and fabricated from polysilicon or other suitable semiconductor materials. As multiple selection gates, as well as memory cell transistors, may be fabricated on top of each other to form a three-dimensional non-volatile memory string, body 403 forms a portion of a channel, such as channel 160. During operation, resistivity of body 403 may be modified based on a voltage level applied to control terminal 401 and a threshold voltage of selection gate 400, which as previously noted is determined by an amount of charge trapped in insulating layers 402. In some cases, the resistivity of body 403 may be increased to the point where current cannot flow through an associated channel.

Control terminal 401 may be constructed as a ring that encircles insulating layers 402 (only a portion of the ring is shown in the illustrated cross-section). Control terminal 401 may be fabricated from polysilicon or other suitable material. In some cases, metals such as tungsten may be included as part of control terminal 401. In various embodiments, control terminal 401 may be connected to a selection signal, such as one of selection signals 130.

Insulating layers 402 may also be constructed as rings surrounding body 403. In some cases, multiple materials may be included in insulating layers 402. For example, insulating layers 402 may include a layered structure of oxide-nitride-oxide (ONO), a high-K dielectric, or other material suitable for insulating control terminal 401 from body 403, as well as for allowing for charge trapping to occur.

During programming, a programming voltage level may be applied to control terminal 401 while body 403 is held at or near ground potential; this programming voltage level is sufficiently large in order allowing electron tunneling to occur. In some cases, the programming voltage level may be greater than a voltage level of a power supply of a non-volatile memory circuit and may be generated by voltage generator or voltage regulator circuit. In response to the electric potential, electrons may tunnel from an oxide layer in insulating layers 402 to a nitride layer included in insulating layers 402, becoming trapped. The number of trapped electrons, which determine a threshold voltage of the selection gate 400, may be determined by the voltage level applied to control terminal 401 as well as a number of times the voltage level is applied to control terminal 401. As described elsewhere in the specification, once the programming voltage level has been applied to control terminal 401, a verification operation may be performed to determine if a sufficient number of electrons have been trapped to achieve a desired threshold voltage.

In cases where selection gate 400 is adjacent to a bit line, a region between selection gate 400 and the bit line may exhibit undesirable electrical characteristics due to manufacturing variation. When this occurs different programming techniques, such as those described above, may be employed to properly program the threshold voltage of selection gate despite the undesirable electrical characteristics of the region between selection gate 400 and the bit line.

It is noted that the embodiment of FIG. 4 is merely an example. Many possible combinations of structures are materials may be used in fabricating selection gates included in three-dimensional non-volatile memory strings. For example, in some cases, the layered structure of insulating materials may include more than three layers, and the control terminal connection may be made from a nitride-based or other suitable material.

Figure 5:
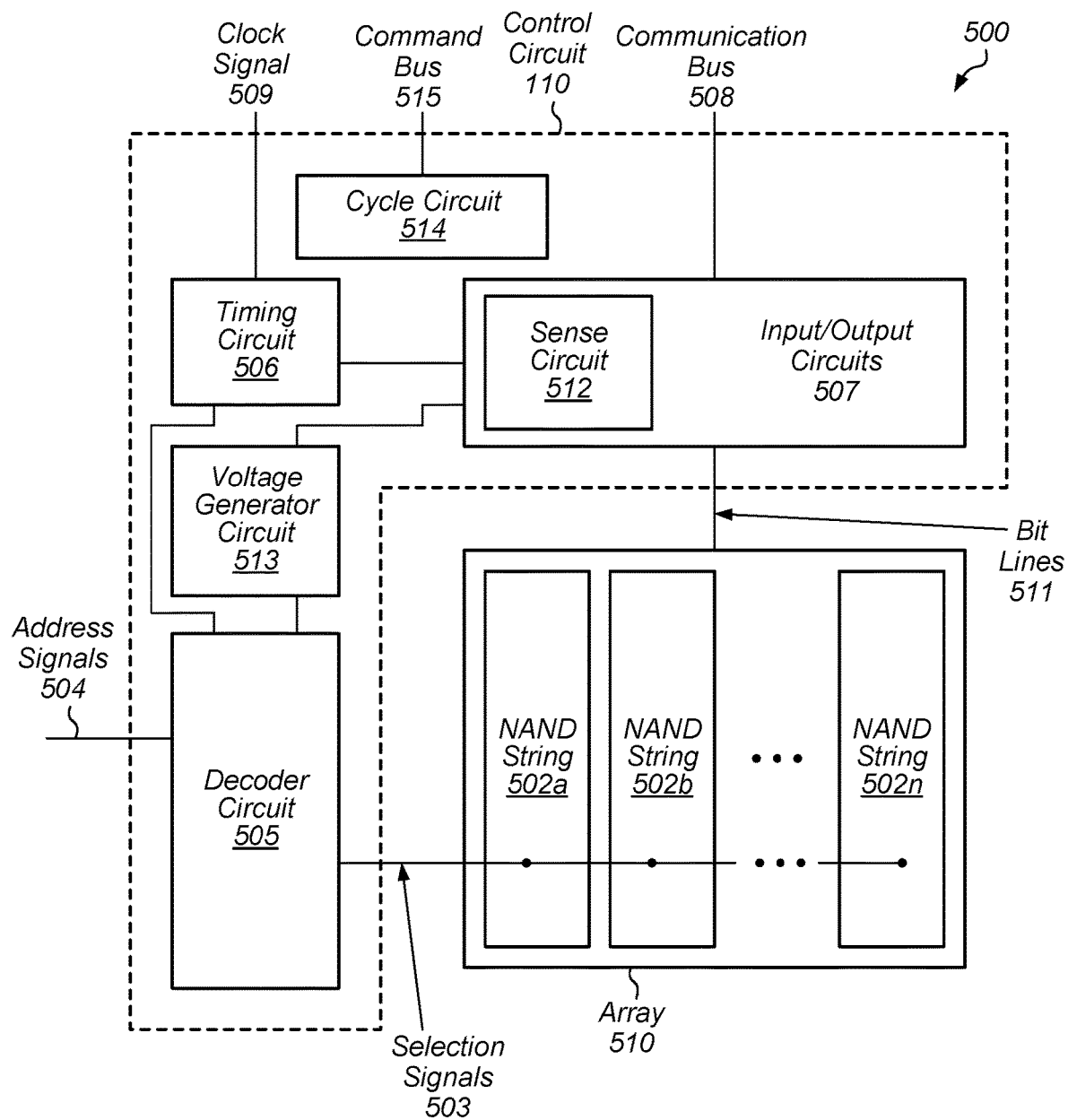
FIG. 5 illustrates a block diagram depicting another embodiment of a memory circuit.

Turning to FIG. 5, an embodiment of a non-volatile memory circuit 500 includes array 510 and control circuit 110. Array 510 includes NAND strings 502a-502n, and control circuit 110 includes timing circuit 506, input/output circuits 507, voltage generator circuit 513, cycle circuit 514, and decoder circuit 505. These components are exemplary and are provided to generally describe operation of circuit 500.

In various embodiments, each of NAND string 502a-502n may correspond to NAND string 200 as illustrated in FIG. 2 and may include multiple memory cell devices along with one or more selection gates. Although three NAND strings are depicted in the embodiment of FIG. 5, in other embodiments, any suitable number of NAND strings may be included in array 510.

As described above, each of the selection gates and the memory cells devices may be programmed in order to set a threshold voltage level for the gates and devices. Once the threshold voltage level for a given selection gate or memory device has been set to a particular value, a voltage level greater than or equal to the particular value is applied to the control terminal of the selection gate or memory device in order to for it to activate and conduct current. Voltage levels on the control terminals that are less than the particular value do not activate the selection gate or memory device.

Decoder circuit 505 is configured to receive and decoder address signals 504. Based on a decode of address signals 504, decoder circuit 505 may assert one or more of selection signals 503. In some cases, different ones of selection signals 503 may be asserted to different voltage levels. For example, if a selection signal coupled to a selection gate that is coupled to one of bit lines 511, decoder circuit 505 may drive the selection signal to a higher voltage level than that used for other selection gates not coupled to bit lines. In various embodiments, decoder circuit 505 may use one or more voltage levels generated by voltage generator circuit 513 in the assertion of selection signals 503.

Voltage generator circuit 513 is configured to generate one or more voltage levels used during selection, programming, and erasing of memory cell device and selection gates included in NAND strings 502a-502n. In various embodiments, voltage generator circuit 513 includes charge pumps, voltage regulator circuits, and any other suitable circuit capable of generating a particular voltage level using a power supply signal.

Input/output circuits 507 are configured to receive data from and transmit data via communication bus 508. In various embodiments, input/output circuits 507 may include data input latch circuits, output driver circuits, voltage level shifter circuits, and the like (all of which are not shown for clarity).

During operation, repeated access to NAND strings 502 can result in threshold voltages of selection devices in NAND strings 502 deviating from desired values. Such deviation can result in problems accessing NAND strings 502 or additional power consumption resulting from leakage current through NAND strings 502. To compensate for threshold voltage drift, non-volatile memory circuit 500 may periodically reprogram the threshold voltages of selection devices using one or the methods described above.

Cycle circuit 514 is configured to track a number of program-and-erase cycles for NAND strings 502. As described below in more detail, cycle circuit 514 may include multiple counter and comparator circuits configured to track received program-and-erase commands directed to particular ones of NAND strings 502 and compare numbers of received program-and-erase commands to a threshold value. Upon determining that a number of program-and-erase commands for a given one of NAND strings 502 satisfies a threshold value, initiate reprogramming of selection devices in the given one of NAND strings 502.

In addition to receiving and sending data, input/output circuits 507 are also configured to determine data stored in memory cell devices included in NAND strings 502a-502n using bit lines 511. Input/output circuits 507 includes sense circuit 512, which as described below in more detail, is used to perform a two-step program-and-verify operation on selection gates included in NAND strings 502a-502n. In some embodiments, sense circuit 512 is configured to use a first sense time as part of an initial program-and-verify operation and use a second sense time that is less than the first sense time as part of a different program-and-verify operation performed subsequent to the initial program-and-verify operation.

As mentioned above, sense circuit 512 may employ two different sense times as part of a two-step program-and-verify operation. It is noted that although sense circuit 512 is described as using two sense times, in other embodiments any suitable number of sense times may be used to increase a resolution of a difference between a threshold voltage of a selection gates and electrical characteristics of a parasitic device. In order to facilitate use of two different sense times, timing circuit 506 may generate an enable signal used by sense circuit 512 to determine the different sense times. As described below in more detail, timing circuit 506 may include multiple timing circuits and is configured to generate the enable signal using clock signal 509.

During the verification portion of a program-and-verify operation, the recently programmed threshold voltage level of the selection gate is sensed. If the sensed value meets a desired level, then the program-and-verify operation ends. Alternatively, if the sensed value is less than the desired level, additional programming and verification steps are performed.

Figure 6:
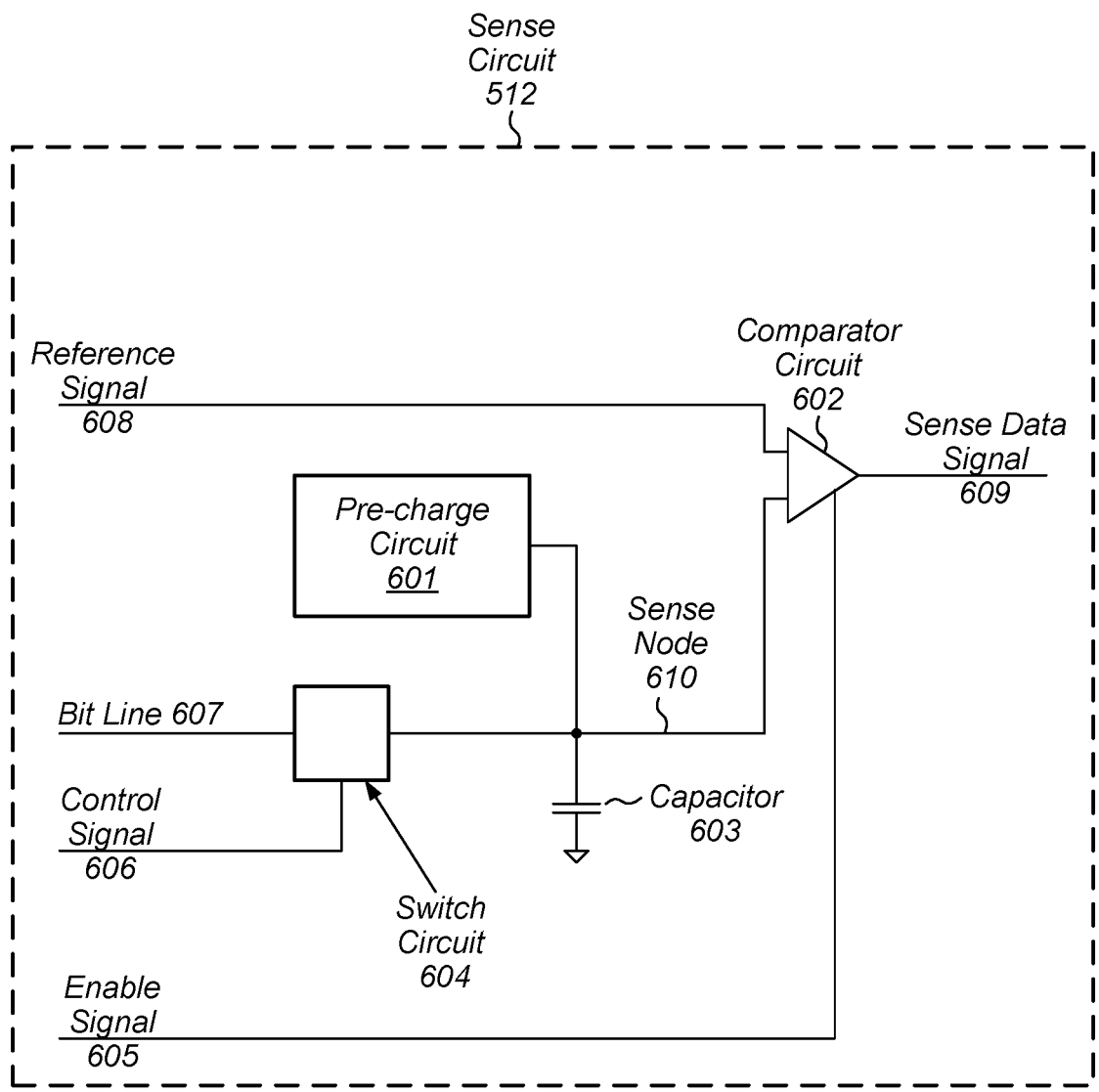
FIG. 6 illustrates a diagram of a sense circuit.

Threshold voltage levels in selection gates, or other transistors whose threshold voltages may be adjusted, may be sensed in a variety of ways. Sense circuit 512 shown in FIG. 6 is an embodiment of a circuit that uses a particular technique for sensing a threshold voltage of a selection gate. As illustrated, sense circuit 512 includes switch circuit 604, pre-charge circuit 601, and comparator circuit 602.

In the embodiment shown, switch circuit 604 selectively couples bit line 607 to sense node 610 based on a value of control signal 606. In various embodiments, switch circuit 604 may include a pass gate or other arrangement of transistors that is configured to couple bit line 607 to sense node 610 based on the value of control signal 606.

Prior to bit line 607 being coupled to sense node 610, pre-charge circuit 601 charges sense node 610 to a particular voltage level. In various embodiments, the particular voltage level may be substantially the same as a voltage level of a power supply signal for sense circuit 512. In some cases, pre-charge circuit 601 may include a transistor that couples sense node 610 to the power supply signal. Alternatively, pre-charge circuit 601 may include a current mirror or other suitable circuit configured to source current to sense node 610 in order to charge sense node 610 to the particular voltage level.

Capacitor 603 is coupled between sense node 610 and a ground circuit node. In various embodiments, a value of capacitor 603 may be selected to generate a sufficiently large time constant so that comparator circuit 602 may detect changes in a voltage level of sense node 610. Capacitor 603 may be constructed using gate capacitance of one or more metal-oxide field-effect transistors (MOSFETs), a metal-oxide-metal structure, or any other suitable structure that provides a desired capacitance value and that can be fabricated using a semiconductor fabrication process.

After sense node 610 is pre-charged to the particular voltage level, switch circuit 604 is activated by control signal 606, coupling bit line 607 to sense node 610. Based on a voltage level of a selection signal applied to a control terminal of the selection gate, the selection gate may or may not conduct current. In the case where the selection gate is conducting current, the voltage level of sense node 610 decreases as capacitor 603 is discharged through the non-volatile memory string that includes the selection gate.

After a time period has elapsed, comparator circuit 602 is activated based on enable signal 605. Once activated, comparator circuit 602 generates sense data signal 609 based on a comparison of a voltage level of reference signal 608 and the voltage level of sense node 610. When sense circuit 507 is used as part of a program-and-verify operation of a selection gate, the voltage level of reference signal 608 may correspond to a desired voltage level to which the threshold voltage of the selection gate is to be set.

As described above, different time periods may be used to activate comparator circuit 602. When a two-step program-and-verify operation is employed to program a selection gate, a second program-and-verify operation may use a time period to activate comparator circuit 602 that is shorter than a time period to activate comparator circuit 602 used in a first program-and-verify operation. By employing a shorter time period during the second program-and-verify operation, the threshold voltage of selection devices without parasitic devices can be completely programmed to the desired level once the threshold voltage of selection devices with parasitic devices has been programmed to a value greater than a voltage level associated with the parasitic device during the first program-and-verify operation.

In various embodiments, sense data signal 609 may be a digital signal whose value indicates whether the voltage level of sense node 610 is above or below the voltage level of reference signal 608. Alternatively, sense data signal 609 may be an analog signal whose voltage level and polarity is indicative of a difference between the voltage level of sense node 610 and the voltage level of reference signal 608.

As illustrated, comparator circuit 602 may be a particular embodiment of a differential amplifier configured to amplify a difference between the voltage level of reference signal 608 and the voltage level of sense node 610. Comparator circuit 602 may, in various embodiments, include self-biasing circuitry to set the operating point of the differential amplifier. In other embodiments, bias circuits may be external to comparator circuit 602 and be shared by multiple differential amplifier circuit included in a memory circuit.

The embodiment illustrated in FIG. 6 is merely an example. In other embodiments, different sensing techniques, such as, e.g., a source follower amplifier coupled to bit line 607, may be employed.

As described above, in order to use different sense currents in sensing a programmed threshold in a selection gate, different sense times are employed. In various embodiments, a longer sense time corresponds to a lower sense current. For example, in some cases, a sense time may be selected that corresponds to a 30 nA sense current. As described above, by employing different sense times and, therefore, different sense currents, the effects of a parasitic device coupled between the selection gates and a bit line coupled to a non-volatile memory string may be remediated, thereby improving yield.

Figure 7:
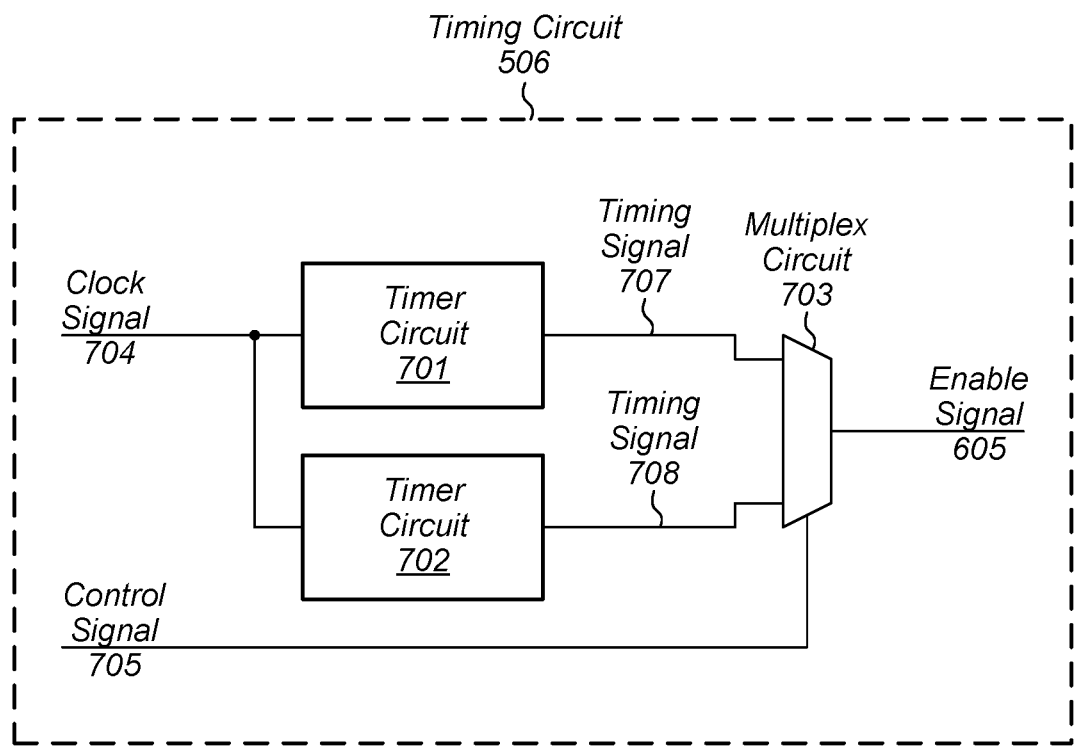
FIG. 7 illustrates a diagram of a timing circuit.

In order to generate the different sense times, a timing circuit is employed. One possible embodiment of such a timing circuit is illustrated in FIG. 7. As illustrated, timing circuit 506 includes timer circuit 701, timer circuit 702, and multiplex circuit 703.

Each of timer circuit 701 and timer circuit 702 are coupled to clock signal 704. Outputs of timer circuit 701 and timer circuit 702, timing signal 707 and timing signal 708, respectively, are coupled to multiplex circuit 703, which is controlled by control signal 705. Although two timer circuits are shown, timing circuit 506 may include any suitable number of such circuits as a particular design warrants.

During operation, timer circuit 701 generates timing signal 707 using clock signal 704. In a similar fashion, timer circuit 702 generates timing signal 708 using clock signal 704. In order to provide two different sense times, there is a difference in timing between timing signal 707 and timing signal 708. In various embodiments, the phase difference between the two timing signals may be based on electrical characteristics of parasitic device 206 and selection gate 203. The phase difference between the two timing signals may be generated in variety of ways.

In some embodiments, timing signals 707 and 708 may be delayed versions of clock signal 704, each delayed a different amount from clock signal 704. In such cases, timer circuit 701 and timer circuit 708 may each include one or more delay strings constructed from constant fanout inverters or other suitable circuit elements to provide different amounts of delay from clock signal 704.

Alternatively, timer circuit 701 and timer circuit 702 may employ analog delay circuits based on charging capacitors with known currents, or they may use one or more counter circuits that track a number of clock edges in order to generate a desired phase difference between timing signal 707 and timing signal 708.

Multiplex circuit 703 is configured to selectively couple one of timing signal 707 or timing signal 708 to enable signal 605 based on control signal 705. For example, during an initial programming operation of a selection gate, verification may be performed with timing signal 707 coupled to enable signal 605. Subsequent to the initial programming operation, another programming operation of the selection gate may be performed with timing signal 708 coupled to enable signal 605.

Multiplex circuit 703 may be designed according to one of various design styles. In some embodiments, multiplex circuit 703 may include multiple static logic gates coupled together to perform the desired multiplex function. In other embodiments, multiplex circuit 703 may include multiple transmission gates coupled together in a wired-OR fashion.

Figure 8:
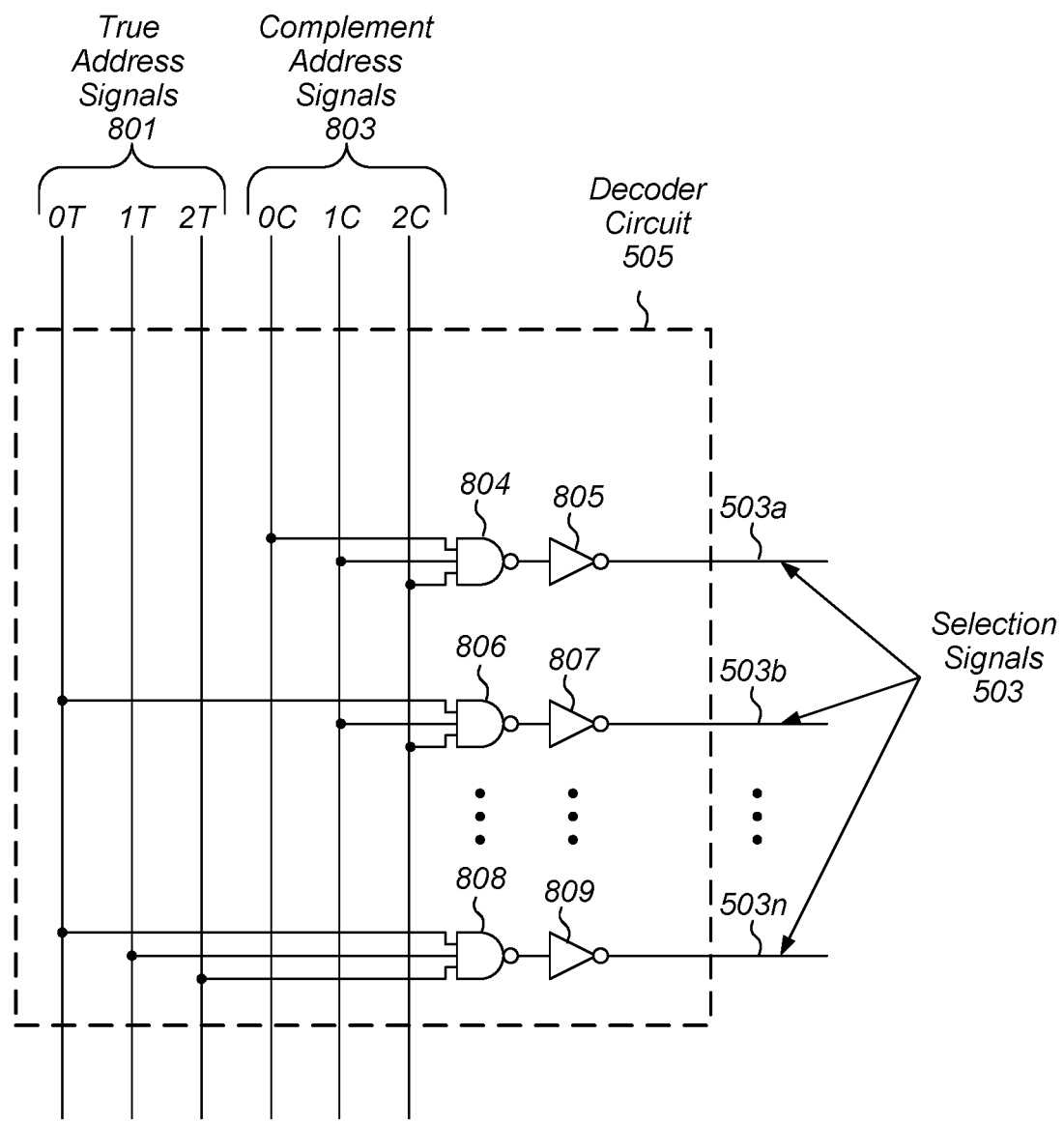
FIG. 8 illustrates a diagram of a decoder circuit.

In order to drive a particular selection signal in a non-volatile memory circuit, multiple levels of decoding may be employed to keep a load on any given portion of the decode circuit low. To accomplish this, one or more decode circuits may be employed. A diagram depicting one possible embodiment of selection signal decode circuit is illustrated in FIG. 8.

In the illustrated embodiment, decoder circuit 505 includes NAND gates 804, 806, and 808, and inverters 805, 807, and 809. NAND gate 804 is coupled to inverter 805, and NAND gate 806 is coupled to inverter 807. Moreover, NAND gate 808 is coupled to inverter 809. Each of NAND gates 804, 806, and 808 are coupled to different ones of true address signals 801 and complement address signals 803. In various embodiments, true address signals 801 and complement address signals 803 may be address signals 504 as illustrated in FIG. 5.

In particular, inputs of NAND gate 804 are coupled to 0C, 1C, and 2C of complement address signals 803. When the logical level of 0C, 1C, and 2C are all high, i.e., the addresses on which the address signals are based are all low, then NAND 804 generates a low logic level on its output, which is, in turn, inverted by inverter 805 to generate a high logic level on selection signal 503a. In a similar fashion, the combination of NAND gate 806 and inverter 807 generates logic levels for selection signal 503b based on 1C and 2C of complement address signals 803, and 0T of true address signals 801. The combination of NAND gate 808 and inverter 809 generates logic levels for selection signal 503n based on 0T, 1T, and 2T of true address signals 801. By connecting the inputs of each NAND gate to different combinations of complement address signals 803 and true address signals 801, the assertion of each of selection signals 503a through 503n is unique.

As used and described herein, a high logic level (or simply a "high") refers to a voltage level sufficient to enable an n-channel MOSFET, and a low logic level (or simply a "low") is a voltage level at or near ground potential. In other embodiments, technologies other than complementary metal-oxide semiconductor (CMOS) may be used, resulting in other voltage levels for the high logic level and the low logic level.

It is noted that an inverter, such as those shown and described herein, may be a particular embodiment of a CMOS inverting amplifier. In other embodiments, however, any suitable configuration of inverting amplifier that is capable of inverting the logical sense of a signal may be used, including inverting amplifiers built using technology other than CMOS. Moreover, a NAND gate, such as those shown and described herein, may be a particular embodiment of a logic circuit configured to perform a negative-AND function using the logic levels on its inputs. Such NAND gates may be implemented using a variety of circuit techniques includes CMOS, transistor-transistor logic (TTL), and the like.

Although the circuit topology depicted in FIG. 8 is described in the context of a decoder circuit, similar circuit topologies may be used for other decoding circuits.

Structures such as those shown with reference to FIGS. 5-8 for programming selection gates included within NAND strings of a non-volatile memory circuit may also be referred to using functional language. In some embodiments, these structures may be described as including "a means for selecting a particular non-volatile memory string coupled to a bit line included in a memory array," "a means for generating multiple sense times," and "a means for performing multiple program-and-verify operations on a selection gate included in the non-volatile memory string using the multiple sense times." In other embodiments, the structures may also be described as including "a means for determining the particular non-volatile memory string satisfies a program-erase cycle threshold" and "a means for performing an erase-and-verify operation on the selection gate using at least one of the multiple sense times."

The corresponding structure for "means for selecting a particular non-volatile memory string" is decoder circuit 505 as well as the equivalents of this circuit. The corresponding structure for "means for generating multiple sense times" is timing circuit 506 and its equivalents. Additionally, the corresponding structure for "means for performing multiple program-and-verify operations" is sense circuit 512 along with its equivalents. The corresponding structure for "means for determining the particular non-volatile memory string satisfies a program-erase cycle threshold" is cycle circuit 514 along with its equivalents. Sense circuit 512 and its equivalents are also the corresponding structure for "means for performing an erase-and-verify operation on the selection gate."

Figure 9:
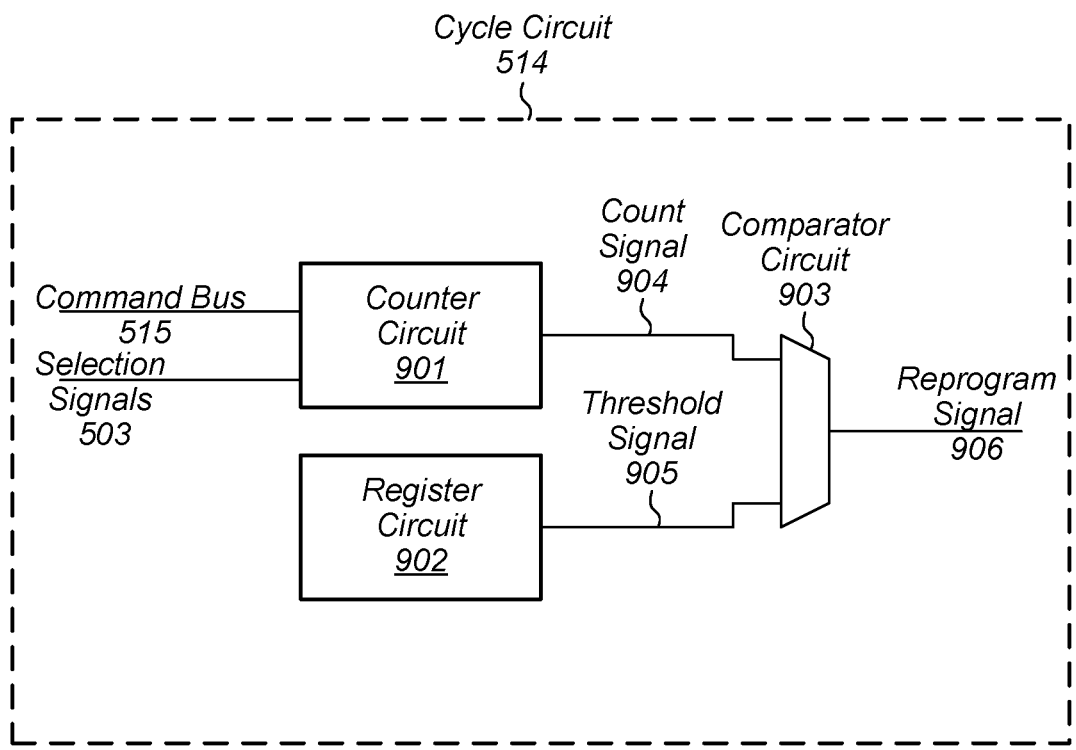
FIG. 9 illustrates a diagram of a cycle circuit.

As described above, selection devices in a NAND string of a non-volatile memory circuit may be programmed after a number of program-and-erase cycles have been performed on memory devices included in the NAND string. To determine when the number of program-and-erase cycles satisfies a threshold value, a cycle circuit may be used to track the number of program-and-erase cycles have been performed. A particular embodiment of a cycle circuit is illustrated in FIG. 9. As illustrated, cycle circuit 514 includes counter circuit 901, register circuit 902, and comparator circuit 903.

Counter circuit 901 is a particular embodiment of a sequential logic circuit configured to increment in response to detection of a program or erase command directed to a particular NAND string in a non-volatile memory circuit and generate counter signal 904. In various embodiments, counter circuit 901 may detect program-and-erase commands directed to the particular NAND string by checking the states of command bus 515 and selection signals 503. In some embodiments, counter circuit 901 may be further configured to reset to a particular value in response to a determination that selection devices in the particular NAND string have been reprogrammed.

Register circuit 902 is configured to store a value indicative of a threshold value of program-and-erase cycles and generate threshold signal 905. In various embodiments, the value stored in register circuit 902 may be modified during operation of the non-volatile memory. In some cases, the modification may be based on usage information, or environmental information such as temperature, power supply voltage level.

Comparator circuit 903 is configured to compare a value of count signal 904 to threshold signal 905 to generate reprogram signal 906. When the value of count signal 904 is greater than or equal to the value of threshold signal 905, comparator circuit 903 may assert reprogram signal 906. In various embodiments, the non-volatile memory circuit may, as described above, reprogram the selection devices of the particular NAND string with new threshold values.

Although only a single counter and comparator circuit is depicted in cycle circuit 514, in other embodiments, cycle circuit 514 may include multiple pairs of counter and comparator circuits, each corresponding to a respective NAND string of the non-volatile memory.

Figure 10:
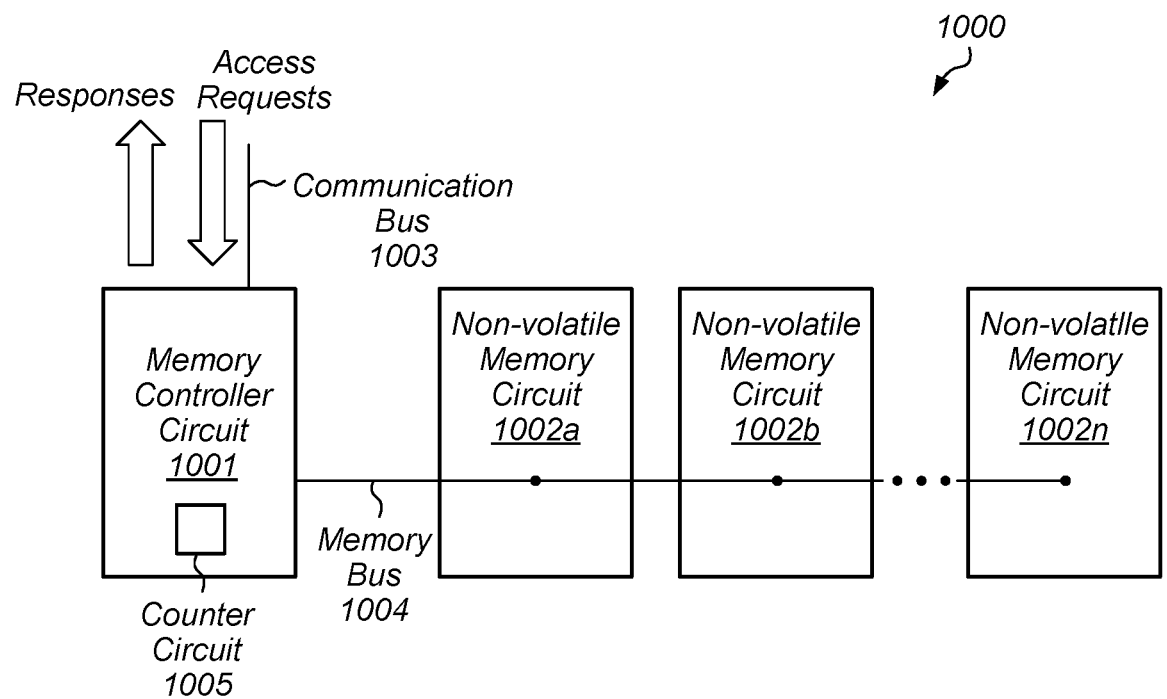
FIG. 10 illustrates a block diagram depicting an embodiment of a memory system.

In some computer systems, multiple non-volatile memory circuits, such as, e.g., memory circuit 500, may be connected to a memory controller circuit to form a memory system. Such memory system may be used in a computer system in lieu of a hard disk drive, allowing high storage densities in a small form factor. An example of such a memory system is illustrated in FIG. 10.

Memory system 1000 includes memory controller circuit 1001 coupled to non-volatile memory circuits 1002a-1002n. In various embodiments, each of non-volatile memory circuits 1002a-1002n may correspond to memory circuit 500 illustrated in FIG. 5. The three memory circuits depicted in FIG. 10 are representative of any suitable number of memory circuits needed for a particular design.

Each of memory circuits 1002a-1002n may be a non-volatile memory circuit that corresponds to memory circuit 500 illustrated in FIG. 5. Memory circuits 1002a-1002n may each include multiple non-volatile memory cells arranged as three-dimensional strings coupled to respective bit lines and source lines within the memory circuits. As described above, a given one of the three-dimensional strings may include one or more selection devices that control the coupling of the string to its corresponding bit line and source line. Threshold voltages of the selection devices may be set following manufacture is complete, and then reset following a completion of a particular number of program-and-erase operations.

Memory controller circuit 1001 is configured to receive memory access requests via communication bus 1003. Such requests may include requests to retrieve (or "read") previously stored data from one of non-volatile memory circuits 1002, or requests to store (or "write") data into one of memory circuits 1002. Upon receiving such a request, memory controller circuit 1001 may translate the request into one or more atomic memory commands transmitted to non-volatile memory circuits 1002 via memory bus 1004. When a particular one or non-volatile memory circuits 1002 performs such atomic commands and transmits data or other signals back to memory controller circuit 1001 via memory bus 1004, memory controller circuit 1001 may generate and transmit a response to an associated request via communication bus 1003.

In addition to processing access requests and resultant responses, memory controller circuit 801 may be configured to determine that a NAND string included in one of non-volatile memory circuits 1002 satisfies a program-erase cycle threshold. Based on the determination, memory controller circuit 1001 may be further configured to initiate resetting of threshold voltages of selection devices included in the NAND string using one of the methods described above. To make such a determination, memory controller circuit 1001 may increment counter circuit 1005 each time the NAND string is either programmed or erased and then compare the value of counter circuit 1005 to the program-erase cycle threshold.

Memory controller circuit 1001 may be designed according to one of various design methodologies. For example, in some embodiments, memory controller 1001 may include one or more state machines or sequential logic circuits configured to perform the functions described above. Alternatively, memory controller circuit 1001 may include a general-purpose processor or processor core configured to execute program or software instructions in order to perform the functions described above.

Figure 11:
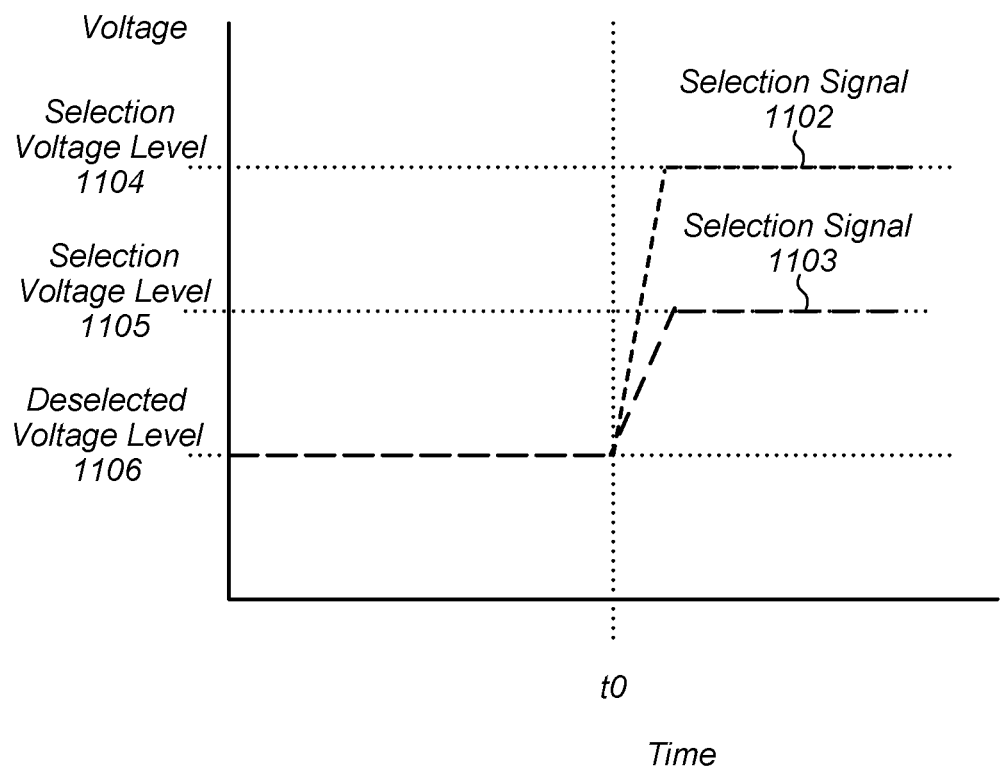
FIG. 11 illustrates example waveforms of selection signals used to access non-volatile memory strings.

In cases where different selection gates are programmed with different threshold voltage levels, selecting a non-volatile memory string may be performed differently. Example waveforms associated with the selection of a non-volatile memory sting with differently programmed selection gates is illustrated in FIG. 11.

Initially, selection signal 1102 and selection signal 1103 start at deselected voltage level 1106. In some cases, deselected voltage level 1106 may be at or near ground potential. It is noted, however, that in some non-volatile memory architectures, the deselected voltage level may be any suitable voltage level including negative voltage levels.

At time t0, the non-volatile memory string is selected in order to program or erase memory cell devices included in the non-volatile memory string. Since the selection gates included in the non-volatile memory string have been programmed with different threshold voltage levels, the voltage levels of the selection signals are different in order to activate the selection gates.

Selection signal 1102 is charged to selection voltage level 1104, while selection signal is charged to selection voltage level 1105. In various embodiments, selection signal 1102 corresponds to selection signal 307a, which is coupled to selection transistor 304a, and selection signal 1103 may correspond to selection signal 307b which is coupled to selection transistor 304b. Since selection transistor 304a is coupled to bit line 360 and closest to any parasitic devices that exist between the itself and bit line, it may be programmed, as described above, to a threshold voltage level greater than threshold voltage levels of the selection transistors. Accordingly, selection voltage level 1104 is greater than selection voltage level 1105. The higher voltage 1104 applied on selection device 304a may create a stronger fringing electrical field that helps to make parasitic device 206 more conducting. Once a desired program or erase operation has been performed, the non-volatile memory string will be deselected by allowing selection signal 1102 and selection signal 1103 to return to deselected voltage level 1106.

It is noted that the waveforms depicted in FIG. 11 are merely an example. In actual circuits, the waveforms may appear differently due to actual electrical characteristics of the circuit elements included in non-volatile memory string. Moreover, the difference in the voltage levels between the selection signals may be different.

As described above, a two-step program-and-verify operation may be employed to program a transistor included in a select gate drain device. A graphical illustration of such a two-step program-and-verify operation is illustrated in FIG. 12A and FIG. 12B.

Figure 12A:
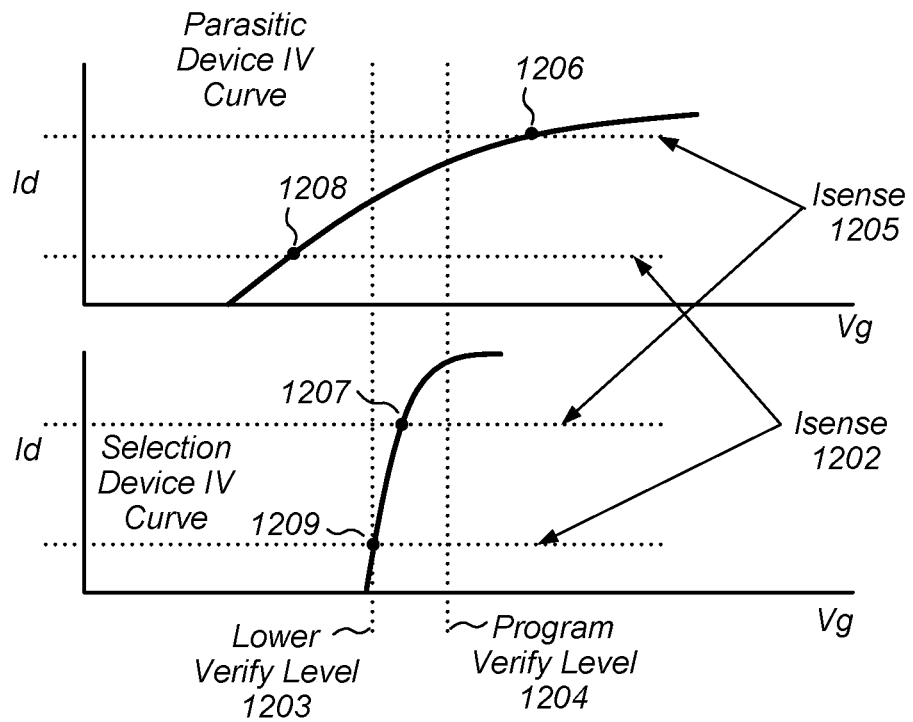
FIG. 12A illustrates example waveforms for a programming operation using an initial sense current.

In FIG. 12A, two current-voltage curves (commonly referred to as "IV curves") are illustrated that depict the first stage of a two-step program-and-verify operation. The top curve is an IV curve for parasitic device 206, while the bottom curve is for selection gate 203. As shown in the IV curve for parasitic device 206, at a voltage level corresponding to a sense current level 1205, the detected threshold voltage through parasitic device 206 appears larger, which masks the characteristics of selection gate 203, preventing proper verification of the programming operation.

By employing a lower sense current, i.e., Isense 1202, during verify stage in selection device programming, the detected threshold voltage level 1208 associated with parasitic device 206 is much lower than the detected threshold voltage level 1209 of selection gate 203 corresponding to Isense 1202. As such, the threshold voltage associated with selection gate 203 can be detected without being masked by the threshold voltage associated with parasitic device 206, thereby allowing proper programming.

Figure 12B:
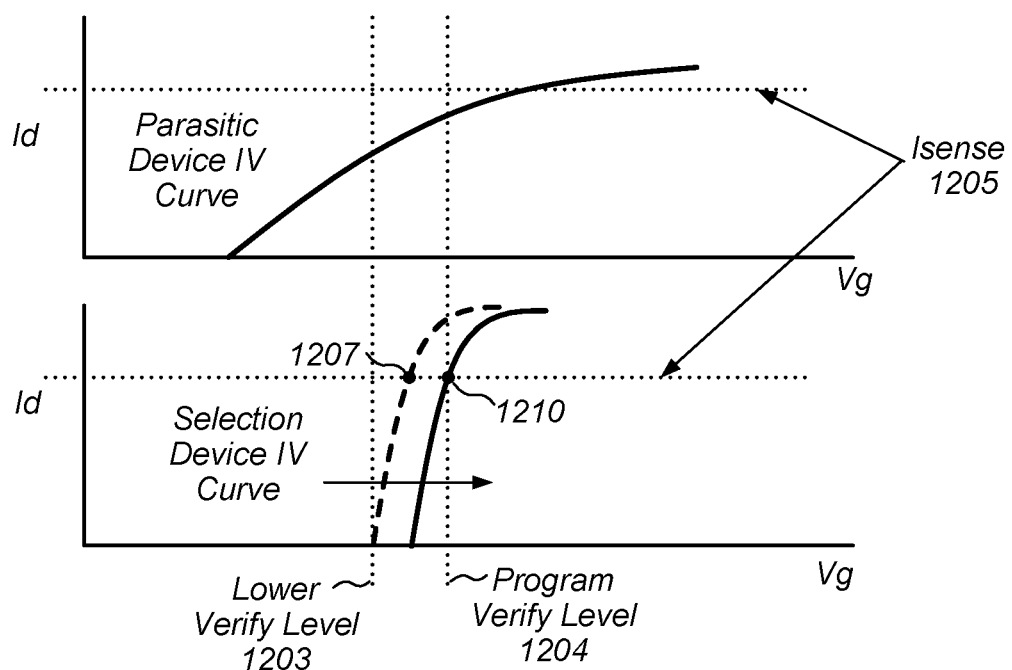
FIG. 12B illustrates example waveforms for a programming operation using another sense current.

In FIG. 12B, two similar IV curves are illustrated that depict the second of the two-step program-and-verify operation. As noted above, the second step of the two-step program-and-verify operation is used to set the threshold of a selection gate to its final level after performing the initial program-and-verify operation. In a similar fashion to FIG. 12A, the top curve in FIG. 12B is an IV curve for parasitic device 206 and the bottom curve in FIG. 12B is for selection gate 203. In this case, Isense 1205 is greater than Isense 1202. As described above, the greater sense current is a result of employing a shorter sense time.

In the IV curves of FIG. 12B, the voltage levels of the individual IV curves where Isense 1205 crosses, are higher than similar voltages in FIG. 12A, where Isense 1202 is less. At the higher sense current values, the voltage difference between the parasitic device 106 and selection gate 203 are less, thereby allowing the threshold voltage of selection gate 203 to be accurately sensed and verified to the final target 1210. By employing this two-step approach, the threshold voltage of selection gate 203 can be properly programmed despite the effects resulting from parasitic device 206.

It is noted that the that waveforms illustrated in FIGS. 12A and 12B are merely examples. In other embodiments, different waveforms are possible due to variation in electrical characteristics the transistors in the select gate drain device and the parasitic device.

Figure 13:
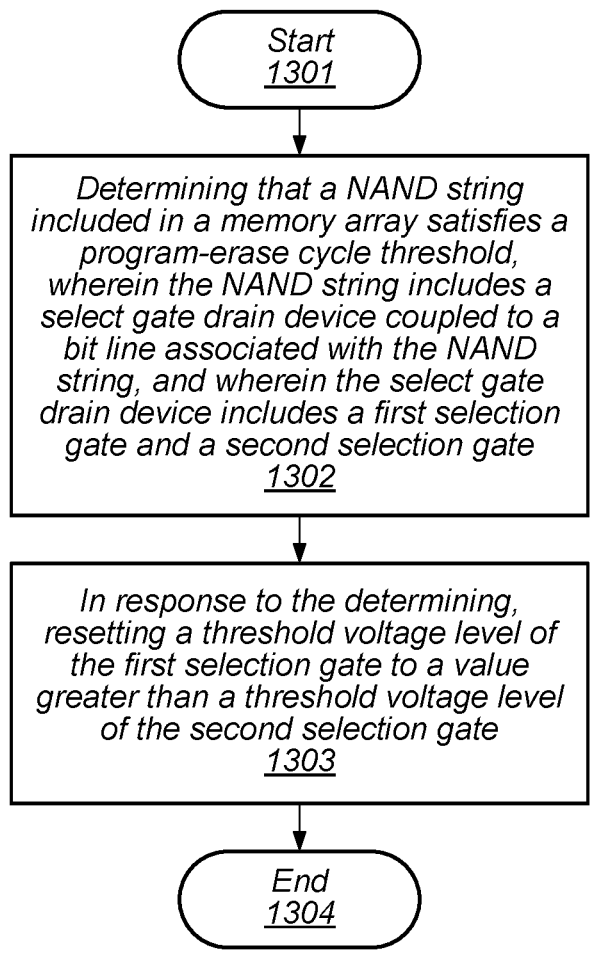
FIG. 13 illustrates a flow diagram depicting an embodiment of a method for programming a selection gate in a NAND string.

A flow diagram illustrating an embodiment of a method for programming a selection device in a non-volatile memory string is depicted in FIG. 13. The method, which begins in block 1301, may be applied to non-volatile memory circuit 100, non-volatile memory circuit 500, or any other suitable non-volatile memory circuit configured to operate in a similar fashion.

The method includes determining that a NAND string included in a memory array satisfies a program-erase cycle threshold (block 1302). The NAND string includes a select gate drain device coupled to a bit line associated with the NAND string. The select gate drain device includes a first selection gate and a second selection gate. In some cases, the first selection gate is coupled between the bit line and the second selection gate. The select gate drain device may, in other embodiments, include a third selection gate coupled to the selection gate.

During operation, the threshold voltage levels of the selection gates included in the select gate drain device may degrade, resulting in difficulties with maintaining isolation between the NAND string and its associated bit line. To combat this, a number of times the NAND string has been programmed and erased may be tracked. In such cases, the method may further include incrementing a counter circuit in response to performing either a programming operation or an erase operation on the NAND string. Determining the NAND string satisfies the program-erase cycle threshold may then include comparing a value of the counter to the program-erase threshold.

The method further includes, in response to the aforementioned determining, resetting a threshold voltage level of the first selection gate to a value greater than a threshold voltage level of the second selection gate (block 1303). In cases when the select gate drain device includes a third selection device, the method may also include resetting a threshold voltage of the third device to a voltage less than the threshold voltage level of the first selection device.

Once the threshold voltage level of the first selection gate has been reset, other access operations, both reads and writes, to the NAND string can continue. To perform such operations, the NAND string is selected, which may include activating the drain select gate using a first control voltage for activating the first selection gate and using a second control voltage for activating the second selection gate. Since the threshold voltage level of the first selection gate was reset to a value greater than a value of the threshold voltage level of the second selection gate, the first control voltage is greater than the second control voltage. The method concludes in block 1304.

It is noted that the embodiment described above is merely an example, and although the method relates to select gate drain devices, in other embodiments, similar techniques may be used to program the threshold voltage of select gate source devices.

Just as programming different selection gates with different threshold voltage values can remediate at least some of the effects associated with parasitic devices between the selection gates and a corresponding bit line, using a two-step programming and verification process may also be employed as described above.

Figure 14:
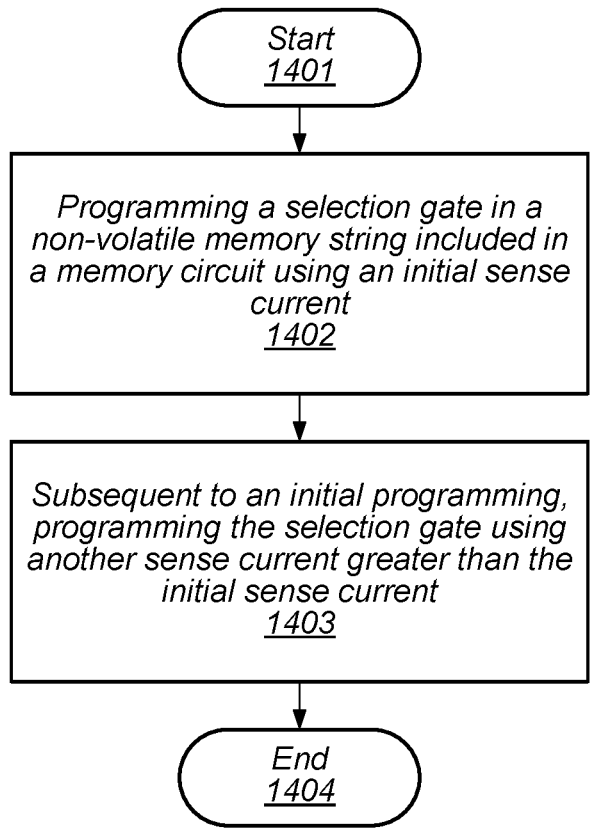
FIG. 14 illustrates a flow diagram depicting an embodiment of a method for programming a selection gate in a NAND string using multiple sense currents.

A flow diagram illustrating an embodiment of a method for programming a selection device in a non-volatile memory string using a two-step programming and verification operation is depicted in FIG. 14. The method, which begins in block 1401, may be applied to non-volatile memory circuit 100, non-volatile memory circuit 500, or any other suitable non-volatile memory circuit configured to operate in a similar fashion.

The method includes programming a selection gate in a non-volatile memory string included in a memory circuit using an initial sense current (block 1402). As described above, after one or more programming pulses have been applied to the selection gate to set its threshold voltage level, verification may be performed to determine if the threshold voltage level has reached a desired level. As part of the verification, a previously charged capacitor may be discharged through a bit line coupled to the selection gate. After a period of time has elapsed, which determines the initial sense current, a voltage level of the capacitor is compared to a reference voltage level corresponding to the desired threshold voltage level.

Once the initial programming and verification has been completed, the method further includes, programming the selection gate using another sense current greater than the initial sense current (block 1403). In this case, a second, shorter period of time, is used before making the comparison of the voltage level across the capacitor to the reference voltage. Using a shorter time period results in a sense current that is larger than the initial sense current.

In some cases, prior to performing the initial program-and-verify operation, an erase-and-verify operation may be performed to set the threshold voltage of the selection gate to a base or unprogrammed level. As with the two-step program-and-verify operation, the erase-and-verify operation may also include two steps. The verification operation in each step may use a respective sense time, in a similar fashion to that described above in regard to the two-step program-and-verify operation. The method concludes in block 1404.

Although the embodiment of the two-step program-and-verify operation is directed to a specific selection gate in a non-volatile memory string, in other embodiments, such a program-and-verify operation may be employed on other selection gates including those coupled to source lines associated with non-volatile memory strings.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    an array of non-volatile memory cell strings including a non-volatile memory cell string including multiple data storage devices and a select gate drain device including multiple selection devices, wherein each of the multiple data storage devices and each of the multiple selection devices are coupled to a channel coupled to a bit line;
    the multiple selection devices including a selection device adjacent to the bit line and configured to control conduction in a portion of the channel; and
    a control circuit configured to program the selection device and at least one other selection device of the multiple selection devices by way of both a first programming operation and a second programming operation;
    wherein the first programming operation sets a threshold voltage of the selection device and sets a threshold voltage of the at least one other selection device; and
    wherein the second programming operation does not set the threshold voltage of the selection device and sets the threshold voltage of the at least one other selection device.

2. The apparatus of claim 1, wherein to program the selection device by way of the first programming operation, the control circuit is further configured to set a threshold voltage of the selection device to a first value; and wherein to program the other selection device by way of the second programming operation, the control circuit is further configured to set a threshold voltage of the other selection device to a second value that is less than the first value.

3. The apparatus of claim 2, wherein the control circuit is further configured to select the non-volatile memory cell string by activating the selection device using a control voltage level greater than another control voltage level used to activate the other selection device.

4. The apparatus of claim 1, wherein to program the selection device by way of the first programming operation, the control circuit is further configured to set a voltage level of the bit line to a ground potential.

5. The apparatus of claim 1, wherein to program the selection device using the first programming operation, the control circuit is further configured to:
    program the selection device using an initial sense time; and
    subsequent to programming the selection device using the initial sense time, program the selection device using another sense time shorter than the initial sense time.

6. The apparatus of claim 5, wherein to program the selection device using the initial sense time, the control circuit is further configured to:
    discharge a previously charged capacitor via the non-volatile memory cell string; and
    compare a voltage level of the capacitor to a reference voltage level after the initial sense time has elapsed.

7. The apparatus of claim 5, wherein the control circuit is further configured to program the other selection device using a single sense time.

8. The apparatus of claim 1, further comprising a parasitic device coupled between the selection device and the bit line, the parasitic device inhibiting the selection device from generating a high-impedance region in the channel.

9. An apparatus, comprising:
    a plurality of NAND strings including a NAND string having a select gate drain device which includes a first selection gate coupled in series between a bit line and a second selection gate;
    a selection circuit configured to select the NAND string for setting threshold voltages for the first selection gate and for the second selection gate; and
    a programming circuit configured to program the first selection gate differently than the second selection gate;
    wherein programming the first selection gate differently than the second selection gate comprises an initial program-and-verify operation which sets a threshold voltage of the first selection gate and a threshold voltage of the second selection gate, and a subsequent program-and-verify operation which does not set the threshold voltage of the first selection gate and sets the threshold voltage of the second selection gate.

10. The apparatus of claim 9, wherein to program the first selection gate differently than the second selection gate, the programming circuit is configured to set the first selection gate to a threshold voltage that is greater than a threshold voltage of the second selection gate.

11. The apparatus of claim 10, wherein the selection circuit is further configured to select the NAND string for accessing a storage gate included in the NAND string by activating the first selection gate using a control voltage level greater than another control voltage level used to activate the second selection gate.

12. The apparatus of claim 9, wherein to program the first selection gate differently than the second selection gate, an initial sense time used in the initial program-and-verify operation is greater than a subsequent sense time used in the subsequent program-and-verify operation.

13. The apparatus of claim 12, wherein to perform the initial program-and-verify operation on the first selection gate, the programming circuit is further configured to:
couple a previously charged capacitor to a bit line that is coupled to the first selection gate; and
compare a voltage level of the previously charged capacitor to a voltage level of a reference signal after the initial sense time has elapsed.

14. A system, comprising:
a plurality of non-volatile memory cell strings;
a decoder circuit configured to select a selection device of a plurality of selection devices included in a select gate drain device of one of the non-volatile memory cell strings; and
a sense circuit configured to:
sense a threshold voltage level of the selection device using an initial sense time as part of an initial program-and-verify operation which sets a threshold voltage of the selection device and sets a threshold voltage of at least one other selection device of the plurality of selection devices; and
sense the threshold voltage level of the selection device using a different sense time as part of a subsequent program-and-verify operation which does not set the threshold voltage of the selection device and sets the threshold voltage of the at least one other selection device, wherein the different sense time is less than the initial sense time.

15. The system of claim 14, wherein the selection device is adjacent to a particular bit line of a plurality of bit lines.

16. The system of claim 15, wherein to sense the threshold voltage of the selection device using the initial sense time, the sense circuit is further configured to:
couple the particular bit line to a previously charged capacitor; and
compare a voltage level of the previously charged capacitor to a voltage level of a reference signal after the initial sense time has elapsed.

17. The system of claim 15, wherein to sense the threshold voltage of the selection device using the different sense time, the sense circuit is further configured to:
couple the particular bit line to a previously charged capacitor; and
compare a voltage level of the previously charged capacitor to a voltage level of a reference signal after the different sense time has elapsed.

18. A method, comprising:
determining that a NAND string included in a memory array satisfies a program-erase cycle threshold, wherein the NAND string includes a select gate drain device coupled to a bit line associated with the NAND string, and wherein the select gate drain device includes a first selection gate and a second selection gate; and
in response to the determining, resetting a threshold voltage level of the first selection gate to a value greater than a threshold voltage level of the second selection gate;
wherein the resetting comprises performing an initial program-and-verify operation which sets the threshold voltage level of the first selection gate and the threshold voltage level of the second selection gate, and a subsequent program-and-verify operation which does not set the threshold voltage level of the first selection gate and sets the threshold voltage level of the second selection gate.

19. The method of claim 18, further comprising selecting the NAND string by activating the select gate drain device using a first control voltage for activating the first selection gate and using a second control voltage for activating the second selection gate, wherein the first control voltage is greater than the second control voltage.

20. The method of claim 18, wherein the first selection gate is coupled between the bit line and the second selection gate.

21. The method of claim 20, wherein the select gate drain device further includes a third selection gate coupled to the second selection gate, and further comprising resetting a threshold voltage level of the third selection gate to a voltage less than the threshold voltage level of the first selection gate.

22. The method of claim 18, further comprising, incrementing a counter circuit in response to performing either a programming operation or an erase operation on the NAND string, and wherein determining the NAND string included in the memory array satisfies the program-erase cycle threshold includes comparing a value of the counter to the program-erase cycle threshold.

23. An apparatus, comprising:
a means for selecting a particular non-volatile memory string coupled to a bit line included in a memory array;
a means for generating multiple sense times; and
a means for performing multiple program-and-verify operations on a selection gate included in a select gate drain device of the non-volatile memory string using the multiple sense times by
performing an initial program-and-verify operation which sets a threshold voltage of the selection gate and sets a threshold voltage of a second selection gate included in the select gate drain device, and a subsequent program-and-verify operation which does not set the threshold voltage of the selection gate and sets the threshold voltage of the second selection gate.

24. The apparatus of claim 23, further comprising a means for determining the particular non-volatile memory string satisfies a program-erase cycle threshold.

25. The apparatus of claim 23, further comprising a means for performing an erase-and-verify operation on the selection gate using at least one of the multiple sense times.

* * * * *